United States Patent
Kaga et al.

(10) Patent No.: US 8,223,316 B2
(45) Date of Patent: Jul. 17, 2012

(54) EXPOSURE APPARATUS AND DEVICE MANUFACTURING METHOD

(75) Inventors: Akihisa Kaga, Utsunomiya (JP); Ryo Kasai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 706 days.

(21) Appl. No.: 12/395,478

(22) Filed: Feb. 27, 2009

(65) Prior Publication Data

US 2009/0220874 A1  Sep. 3, 2009

(30) Foreign Application Priority Data

Mar. 3, 2008 (JP) ................................. 2008-052580

(51) Int. Cl.
*G03B 27/32* (2006.01)
*G03B 27/42* (2006.01)
*G03B 27/54* (2006.01)
*G03B 27/74* (2006.01)

(52) U.S. Cl. ................. 355/68; 355/53; 355/67; 355/77
(58) Field of Classification Search ............... 250/492.2; 355/53, 66–69, 71, 77; 356/215, 222
See application file for complete search history.

(56) References Cited

U.S. PATENT DOCUMENTS

| 7,486,379 | B2 | 2/2009 | Kanazawa | |
|---|---|---|---|---|
| 2006/0017051 | A1* | 1/2006 | Asaishi | 257/48 |
| 2008/0083885 | A1* | 4/2008 | Wilhelmus Van Herpen et al. | 250/493.1 |
| 2009/0002663 | A1* | 1/2009 | Freimann et al. | 355/67 |

FOREIGN PATENT DOCUMENTS

| JP | 11-260688 A | 9/1999 |
|---|---|---|
| JP | 2001-284235 A | 10/2001 |
| JP | 2002-208549 A | 7/2002 |
| JP | 2006-303193 A | 11/2006 |
| WO | WO 2007062808 A1 * | 6/2007 |

* cited by examiner

*Primary Examiner* — Hung Henry Nguyen
*Assistant Examiner* — Colin Kreutzer
(74) *Attorney, Agent, or Firm* — Canon USA Inc IP Division

(57) ABSTRACT

An exposure apparatus includes an optical path in which a plurality of optical units are arranged and which includes a portion of projecting a pattern of an original onto a substrate to expose the substrate to light, and a controller configured to monitor deteriorations, due to light, of the plurality of optical units, wherein the controller is configured to monitor each of a plurality of sections of the optical path each of which includes at least one optical unit, for deterioration of the at least one optical unit belonging to a corresponding section.

5 Claims, 4 Drawing Sheets

EXPOSURE APPARATUS AND DEVICE MANUFACTURING METHOD

BACKGROUND OF THE INVENTION

1. Field of the Invention

The present invention relates to an exposure apparatus and a device manufacturing method using the same.

2. Description of the Related Art

Along with the recent increase in the packing density of semiconductor devices, an exposure apparatus used in lithography for manufacturing these devices has come to use a pulsed laser such as a KrF or ArF excimer laser as a light source having a wavelength in the far-ultraviolet region, in place of a mercury lamp. In an exposure apparatus which uses an excimer laser, the excimer laser light source and the exposure apparatus major portion can be connected via an interface cable such as an optical fiber. The exposure operation of such an exposure apparatus can be controlled by a control device provided to the exposure apparatus major portion. The exposure apparatus major portion illuminates a reticle with pulsed laser light emitted by the excimer laser. The pattern of the reticle illuminated is projected onto a wafer coated with a photosensitive agent by a projection optical system, thereby forming a latent image on the resist.

The laser chamber of an excimer laser is generally filled with a mixed gas containing three types of gases: a halogen gas such as fluorine gas, an inert gas such as krypton or argon gas, and a rare gas such as helium or neon gas. The excimer laser light source emits pulsed laser light having a pulse width on the order of nanoseconds by performing electric discharge in the chamber so that the halogen gas and the inert gas react with each other.

The photon energy of excimer laser light is 114.1 kcal/mol for KrF (248 nm), 147.2 kcal/mol for ArF (193 nm), or 180.1 kcal/mol for $F_2$ (157 nm). In contrast, the binding/dissociation energy of molecules is, for example, 84 kcal/mol for the carbon-carbon bond. In other words, the optical energies in this wavelength range correspond to the bonding/dissociation energies of various substances. For this reason, irradiating various substances with excimer laser light readily cause light absorption or photochemical reactions of these substances. Because of this property, light having a wavelength in this wavelength range is often used in processing (e.g., CVD and etching) of various substances. Also, because the optical characteristics such as the absorption and reflection characteristics differ among substances, excimer laser light can also be used in structure analysis of the substances.

However, exposure light having a wavelength in the wavelength range of excimer laser light is absorbed by oxygen or moisture in the atmosphere. This is because the photon energy of the exposure light increases as the wavelength of the exposure light shortens. An increase in the photon energy activates photochemical reactions which involve the substances present in the optical path. This makes it necessary to purge the interior of an optical unit, through which the exposure light passes, using an inert gas such as nitrogen or helium gas (Japanese Patent Laid-Open No. 2001-284235). Although light absorption and the like can be suppressed by the purge, it is difficult to perfectly eliminate all impurities present in the optical unit. The optical unit is contaminated upon, for example, the light absorption of the substances adhering on the optical unit or the decomposition or generation of substances due to photochemical reactions. In addition, if a nitrogen gas atmosphere contains water vapor, irradiating the optical unit with ultraviolet light generates ammonia. The optical unit irradiated with laser light is contaminated or deteriorated due to these factors.

Conventionally, because the exposure apparatus is not imparted with a function of detecting deterioration in the optical performance in advance, it is determined that an optical unit of the exposure apparatus has come to the end of its lifetime by confirming that an abnormality has occurred in an exposure process or measurement process. It is therefore necessary to specify and prepare components necessary for restoration after an abnormality has been detected and to restore the normal operation of the apparatus. It takes a long time to reactivate the exposure apparatus. Also, when an exposure process is performed using an optical unit which has already come to the end of its lifetime, defective products may be manufactured due to deterioration in the optical performance.

SUMMARY OF THE INVENTION

It is an exemplary object of the present invention to provide a technique advantageous to improving the efficiency of the maintenance work for a plurality of optical units included in an exposure apparatus.

According to the first aspect of the present invention, there is provided an exposure apparatus including an optical path in which a plurality of optical units are arranged and which includes a portion of projecting a pattern of an original onto a substrate to expose the substrate to light, comprises a controller configured to monitor deteriorations, due to light, of the plurality of optical units, wherein the controller is configured to monitor each of a plurality of sections of the optical path each of which includes at least one optical unit, for deterioration of the at least one optical unit belonging to a corresponding section.

According to the second aspect of the present invention, there is provided a method of manufacturing a device, the method comprising exposing a substrate to light using an exposure apparatus, developing the exposed substrate, and processing the developed substrate to manufacture the device, wherein the exposure apparatus includes an optical path in which a plurality of optical units are arranged and which includes a portion of projecting a pattern of an original onto a substrate to expose the substrate to light, and a controller configured to monitor deteriorations, due to light, of the plurality of optical units, wherein the controller is configured to monitor each of a plurality of sections of the optical path each of which includes at least one optical unit, for deterioration of the at least one optical unit belonging to a corresponding section.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

Figure 1:
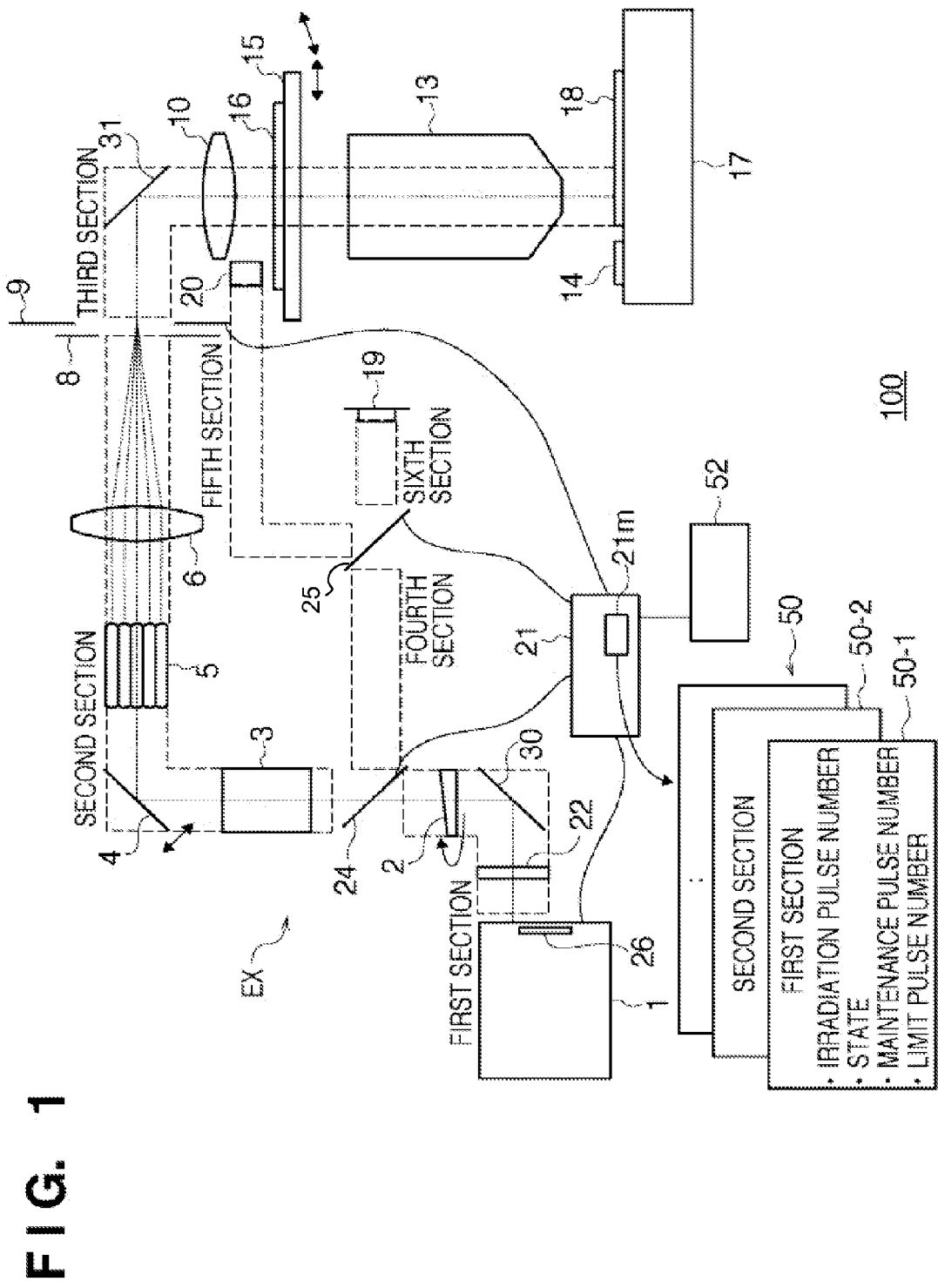
FIG. 1 is a view showing the schematic arrangement of an exposure apparatus according to a preferred embodiment of the present invention.

FIG. 1 is a view showing the schematic arrangement of an exposure apparatus according to a preferred embodiment of the present invention. An exposure apparatus 100 according to a preferred embodiment of the present invention has an optical path in which a plurality of optical units are arranged and which includes a portion to project the pattern of a reticle (original) 16 onto a wafer (substrate) 18 to expose the wafer 18 to light.

The optical path of the exposure apparatus 100 is provided with light emitted by a light source 1. A controller 21 of the exposure apparatus 100 divides the optical path into a plurality of sections, and monitors each of the divided sections for light-induced deteriorations in optical units belonging to the sections. Note that one divided section includes at least one optical unit. In this embodiment, the plurality of sections include first to sixth sections.

The arrangement and operation of the exposure apparatus 100 will be explained schematically. The exposure apparatus 100 includes the light source 1 and major portion EX. The major portion EX performs processes such as an exposure process and measurement process using light emitted by the light source 1.

The light source 1 can be configured to emit pulsed light. The light source 1 can include, for example, an excimer laser. The light source 1 includes a shutter 26. Light is provided from the light source 1 to the major portion EX while the shutter 26 is open, and it is not provided from the light source 1 to the major portion EX while the shutter 26 is closed. Light emitted by the light source 1 is guided to the major portion EX, is attenuated by a neutral density filter 22 as needed, and passes through a wedge-shaped optical element 2 after its optical path is bent by a mirror 30. In this embodiment, the first section is the optical path from the entrance plane of the neutral density filter 22 to the exit plane of the wedge-shaped optical element 2. The neutral density filter 22 and wedge-shaped optical element 2 are examples of the optical unit.

In an exposure process, the controller 21 controls a mirror 24 so that the light leaving the first section enters the second section. In this embodiment, the second section is the optical path from the entrance plane of a beam shaping unit 3 to the exit plane of an exposure slit member 8. The light emerging from the beam shaping unit 3 sequentially passes through a fly-eye lens 5 and a condenser lens 6 after its optical path is bent by a vibrated mirror 4, and reaches the exposure slit member 8. The beam shaping unit 3, vibrated mirror 4, fly-eye lens 5, condenser lens 6, and exposure slit member 8 are examples of the optical unit.

The light leaving the second section passes through the opening portion of a light shielding plate 9, passes through a collimator lens 10 after its optical path is bent by a mirror 31, and illuminates the reticle (original) 16 held by a reticle stage (original stage) 15. The pattern of the reticle 16 illuminated is projected by a projection optical system 13 onto the wafer (substrate) 18 held by a wafer stage (substrate stage) 17. The wafer 18 is coated with a photosensitive agent. The photosensitive agent is exposed by the pattern projection so that a latent image is formed on the wafer 18. The latent image is visualized into a physical pattern by a development process. In this embodiment, the third section is the optical path from the light shielding plate 9 to the wafer 18. The light shielding plate 9, mirror 31, and collimator lens 10 are examples of the optical unit. An illuminance nonuniformity sensor can be arranged on the wafer stage 17.

In a first measurement process, the controller 21 controls the mirror 24 and a mirror 25 so that the light leaving the first section enters the fourth section, and that leaving the fourth section enters the fifth section. In this embodiment, the fourth section is the optical path from the reflection plane of the mirror 24 to that of the mirror 25, and the fifth section is the optical path from the entrance plane (not shown) of the light reflected by the mirror 25 to the exit plane of an off-axis scope 20. The first measurement process can include, for example, a measurement process for focus adjustment and a measurement process for alignment between the reticle 16 and the wafer 18. These measurement processes can be performed by the TTL scheme. The mirrors 24 and 25 and off-axis scope 20 are examples of the optical unit.

In a second measurement process, the controller 21 controls the mirrors 24 and 25 so that the light leaving the first section enters the fourth section, and that leaving the fourth section enters the sixth section. The second measurement process can include, for example, a process of measuring a misalignment between the optical axis of the light source 1 and that of the major portion EX. In this embodiment, the sixth section is the optical path from the entrance plane (not shown) of the light reflected by the mirror 25 to a monitor 19. The monitor 19 is an example of the optical unit.

In short, light emitted by the light source 1 passes through the first, second, and third sections in the exposure process, passes through the first, fourth, and fifth sections in the first measurement process, and passes through the first, fourth, and sixth sections in the second measurement process. That is, in this embodiment, sections through which the light passes of the first to sixth sections are changed in accordance with the process performed by the exposure apparatus 100.

The controller 21 includes a memory 21m. The memory 21m holds maintenance information 50 for maintaining a plurality of optical units as mentioned above. The maintenance information 50 includes pieces of section maintenance information 50-1, 50-2, . . . for the first to sixth sections. Each section maintenance information includes information about maintenance of an optical unit belonging to a corresponding section. Each section maintenance information can include, for example, "Irradiation Pulse Number", "State" (Normal, Maintenance, or Limit), "Maintenance Pulse Number", and "Limit Pulse Number". The "Irradiation Pulse Number" is the integration value of the number of pulses of light which enters a corresponding section. The "State" represents the state of an optical unit belonging to a corresponding section. More specifically, the "Normal" state means a normal state. The "Maintenance" state means a state in which an optical unit is close to a limit within which it is usable. The "Limit" state means a state in which an optical unit has reached a limit within which it is usable and requires replacement. The "Maintenance Pulse Number" means a pulse number serving as a first threshold according to which a corresponding section is in the "Maintenance" state. The "Limit Pulse Number" means a pulse number serving as a second threshold according to which a corresponding section is in the "Limit" state. As is obvious from the above description, the second threshold is a threshold to determine that the degree of deterioration is higher than the first threshold.

Figure 2:
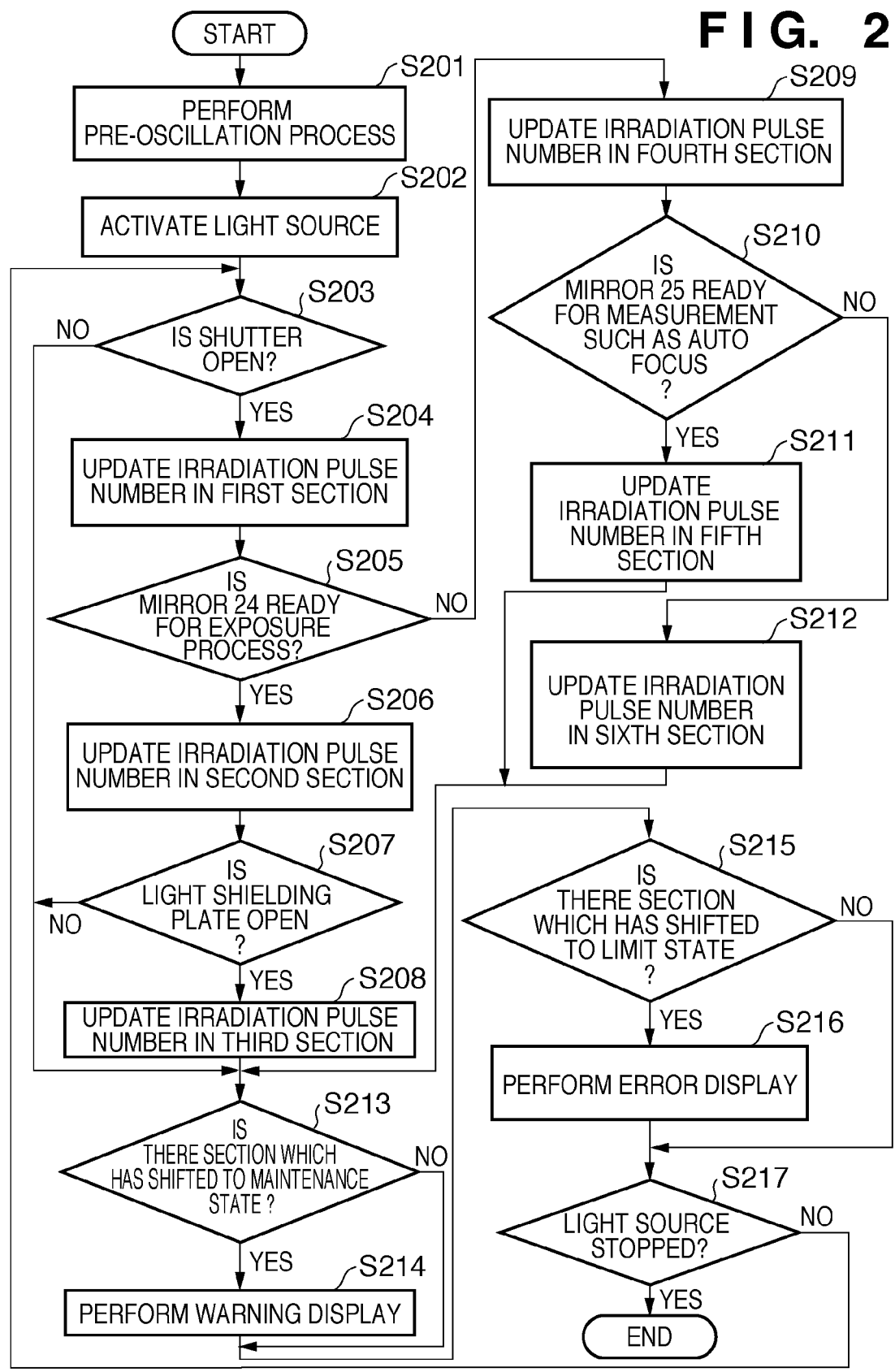
FIG. 2 is a flowchart illustrating control of a controller.

FIG. 2 is a flowchart illustrating control of the controller 21. In step S201, the controller 21 performs a pre-oscillation process. The pre-oscillation process can include, for example, a process of displaying, on a display unit 52, at least one of an optical unit with a degree of deterioration higher than a threshold, and a section including the optical unit. More specifically, the pre-oscillation process can include, for example, a process of displaying, on the display unit 52, information for notifying the operator of at least one of an optical unit which is close to a limit within which it is usable, and a section including the optical unit. Alternatively, the pre-oscillation process can include a process of displaying, on the display unit 52, information for notifying the operator of at least one of an optical unit which has reached a limit within which it is usable and requires replacement, and a section including the optical unit. Alternatively, the pre-oscillation process can include a process of inhibiting activation of the light source 1 under a condition in which an optical unit which has reached a limit within which it is usable and requires replacement is used. The optical unit which is close to a limit within which it is usable is an optical unit belonging to a section in which the information representing the "State" in the section maintenance information is "Maintenance". The optical unit which has reached a limit within which it is usable and requires replacement is an optical unit belonging to a section in which the information representing the "State" in the section maintenance information is "Limit".

In step S202, the controller 21 activates the light source 1 to emit laser light. In step S203, the controller 21 confirms the state of the shutter 26. If the shutter 26 is open, the controller 21 advances the process to step S204. If the shutter 26 is closed, the light source 1 advances the process to step S213. In step S204, the controller 21 updates the irradiation pulse number in the first section through which the light guided from the light source 1 passes.

In step S205, the controller 21 confirms the state of the mirror 24. If the mirror 24 is arranged such that the light leaving the first section enters the second section, that is, it is ready for the exposure process, the controller 21 advances the process to step S206. If the mirror 24 is arranged such that the light leaving the first section enters the fourth section, the controller 21 advances the process to step S209. In step S206, the controller 21 updates the irradiation pulse number in the second section through which the light passes.

In step S207, the controller 21 confirms the state of the light shielding plate 9. If the light shielding plate 9 is open, in step S208 the controller 21 updates the irradiation pulse number in the third section through which the light passes. If the light shielding plate 9 is closed, the controller 21 advances the process to step S213.

In step S209, the controller 21 updates the irradiation pulse number in the fourth section through which the light passes. In step S210, the controller 21 confirms the state of the mirror 25. If the mirror 25 is arranged such that the light leaving the fourth section enters the fifth section, that is, it is ready for the first measurement process, the controller 21 advances the process to step S211. If the mirror 25 is arranged such that the light leaving the fourth section enters the sixth section, that is, it is ready for the second measurement process, the controller 21 advances the process to step S212.

In step S211, the controller 21 updates the irradiation pulse number in the fifth section through which the light passes. In step S212, the controller 21 updates the irradiation pulse number in the sixth section through which the light passes.

In step S213, the controller 21 confirms the states of optical units belonging to the first to sixth sections. If a section which has shifted from the normal state to the maintenance state is present, the controller 21 advances the process to step S214; otherwise, it advances the process to step S215. The process in step S213 can be interpreted as an example of a process of monitoring the first to sixth sections for light-induced deteriorations in optical units belonging to the first to sixth sections.

In step S214, the controller 21 performs warning display on the display unit 52. The warning display can include, for example, at least one of information representing a section which has shifted from the normal state to the maintenance state, and an optical unit belonging to the section. The warning display can also include information representing the state (maintenance state) of the section. The warning display can also include a message for prompting the operator to prepare for replacement of a corresponding optical unit (e.g., preparation of an optical unit for replacement). Such message display is effective in preventing the stop of the exposure apparatus over a long period of time due to the absence of an optical unit for replacement.

In step S215, the controller 21 confirms the states of the first to sixth sections. If a section which has shifted from the maintenance state to the limit state is present, the controller 21 advances the process to step S216; otherwise, it advances the process to step S217. The process in step S215 can be interpreted as an example of a process of monitoring the first to sixth sections for light-induced deteriorations in optical units belonging to the first to sixth sections.

In step S216, the controller 21 performs error display on the display unit 52. The error display can include, for example, at least one of information representing a section which has shifted from the maintenance state to the limit state, and an optical unit belonging to the section. The error display can also include information representing the state (limit state) of the section. The error display can also include a message for prompting the operator to replace a corresponding optical unit with a new one.

To prevent any loss of the maintenance information 50, the memory 21m which holds it can be configured as a nonvolatile memory. The scope of the nonvolatile memory includes, for example, memories, which have a nonvolatility by themselves, such as an EEPROM and hard disk, and a DRAM which maintains power supply by a battery backup function. Also, the maintenance information 50 may be copied to other storage devices (not shown) such as a storage device of a console as a backup copy.

When the optical unit is replaced with a new one, the information of the irradiation pulse number which constitutes the maintenance information (section maintenance information) is cleared to zero. Thresholds to determine shifts in states such as the maintenance pulse number and limit pulse number can be changed in accordance with, for example, change in the specification of an optical unit.

Figure 4:
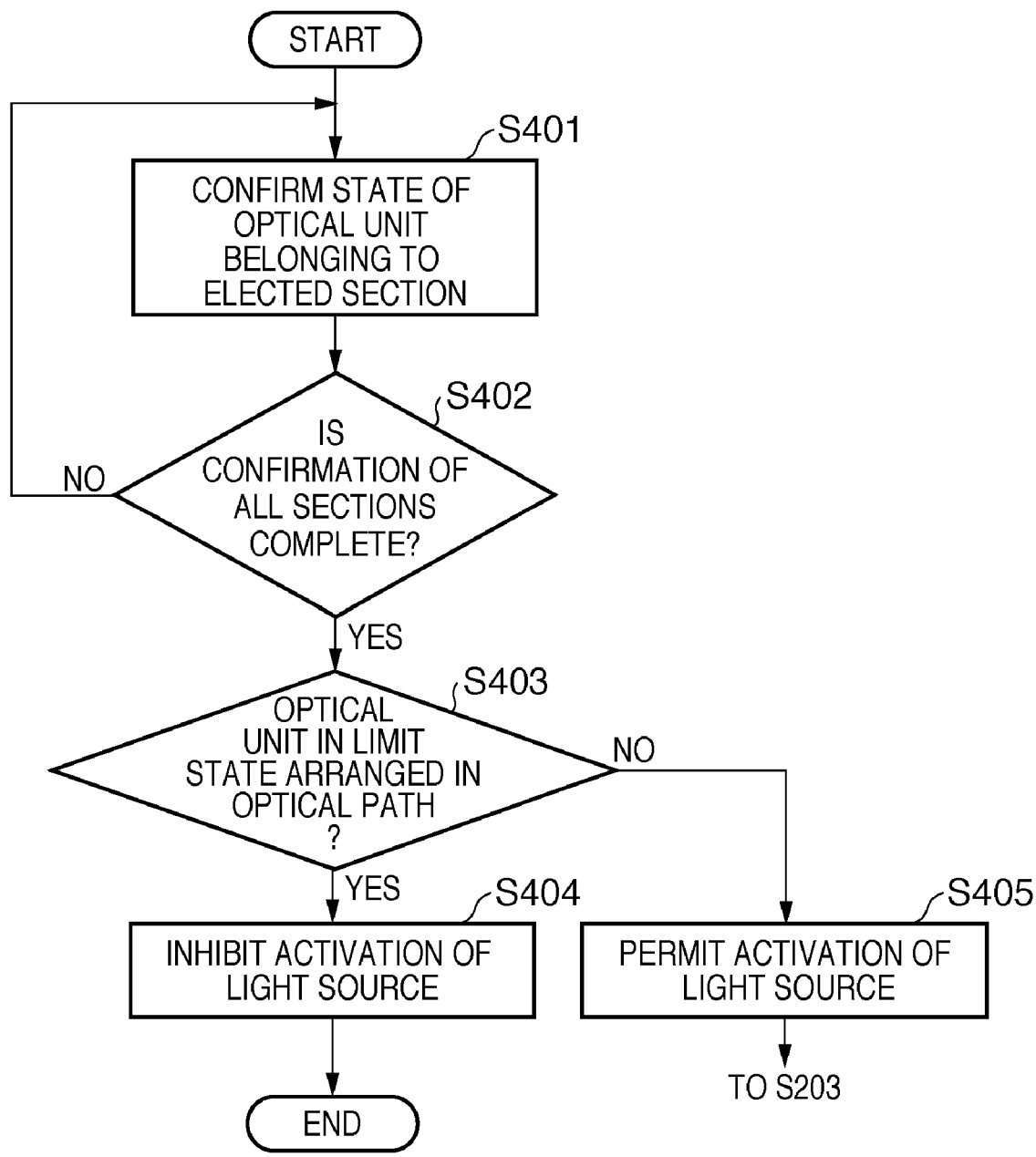
FIG. 4 is a flowchart illustrating a detailed example of a process in step S201 of FIG. 2.

FIG. 4 is a flowchart illustrating a detailed example of the process in step S201 of FIG. 2. In step S401, the controller 21 confirms the state of an optical unit belonging to the selected section based on the maintenance information 50. In step S402, the controller 21 determines whether the confirmation in step S401 is complete for all of the first to sixth sections. If the confirmation in step S401 is complete for all the sections, the controller 21 advances the process to step S403; otherwise, it returns the process to step S401, and performs the confirmation for the next section.

In step S403, the controller 21 determines whether the section used includes an optical unit in the limit state. If the section used includes an optical unit in the limit state, the controller 21 inhibits activation of the light source 1, and ends the process. If the section used includes no optical unit in the limited state, in step S405 the controller 21 permits activation of the light source 1, and advances the process to step S203 in FIG. 2. It is possible to prevent the manufacture of any defective devices by inhibiting activation of the light source 1 if the section used includes an optical unit in the limit state.

Figure 3:
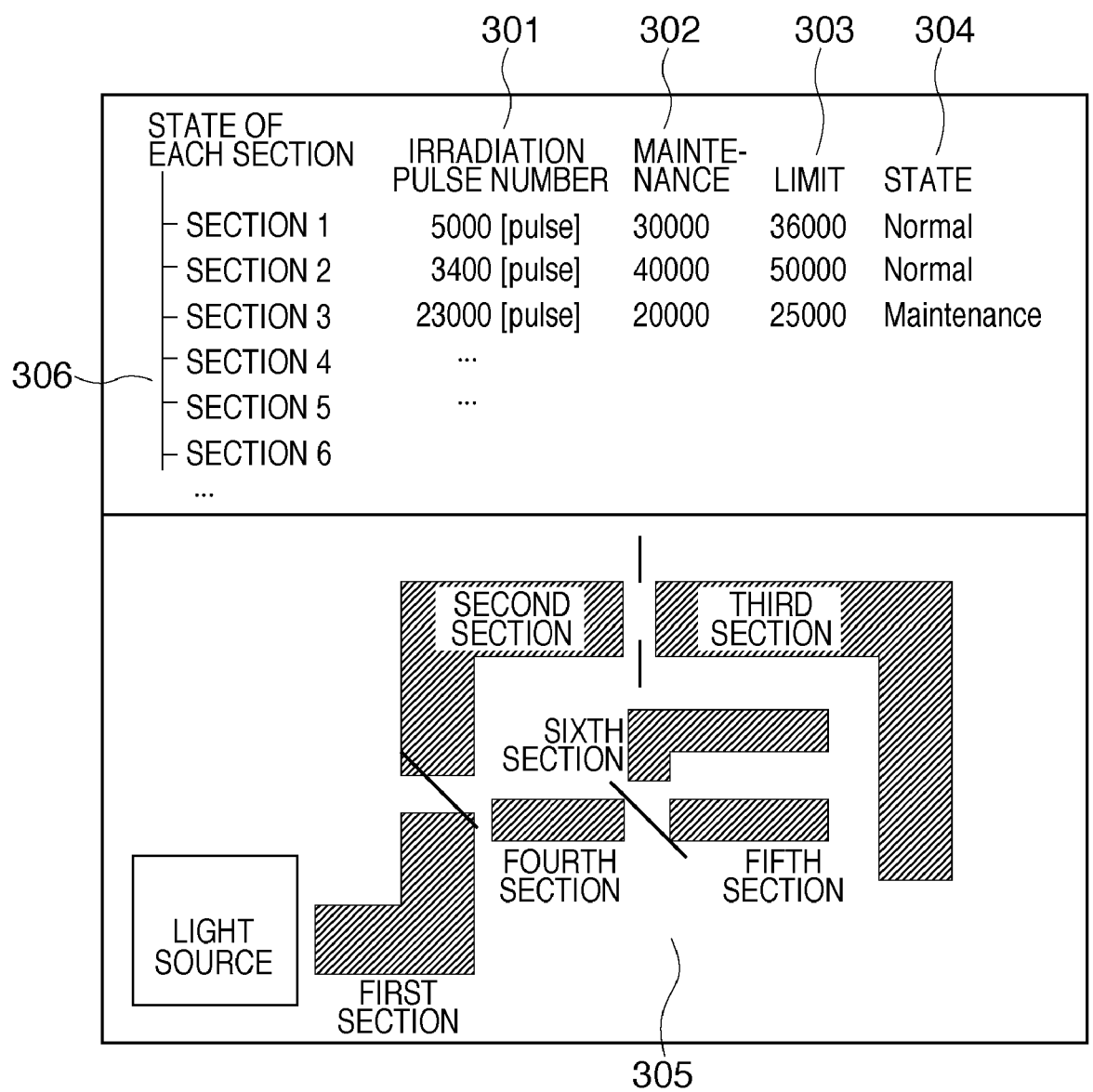
FIG. 3 is a view showing an example of the display window on a display unit.

FIG. 3 is a view showing an example of the display window on the display unit 52. Information displayed on the display window can include information representing an irradiation pulse number 301, maintenance pulse number 302, limit pulse number 303, and state 304 for each of the first to sixth sections and subsequent sections. The operator can change the items to be displayed on the display window.

The controller 21 can display information representing states such as "Normal", "Maintenance", and "Limit" on the display unit 52 in accordance with the state of each section.

Information displayed on the display window can also include, for example, information (division drawing) 305 representing the division form of the optical path (the arrangement form of the first to sixth sections). The controller 21 may assign colors or patterns to the states of the first to sixth sections such that, for example, the normal state is indicated by blue, the maintenance state is indicated by yellow, and the limit state is indicated by red.

If the optical path is divided into a maximum number of sections, each section includes only one optical unit. In this case, the states of the optical units are managed individually.

As described above, in this embodiment, the optical path of an exposure apparatus is divided into a plurality of sections, each of which includes at least one optical unit, and each section is monitored for light-induced deteriorations in optical units belonging to the divided sections. This makes it possible to, for example, prepare in advance a new optical component to replace an old optical component whose replacement period is coming up, and to preplan the maintenance work. Hence, this technique contributes to improving the efficiency of a work to maintain a plurality of optical units included in an exposure apparatus.

A method of manufacturing a device (e.g., a semiconductor device or a liquid crystal display device) according to one embodiment of the present invention will be explained next.

A semiconductor device is manufactured by a preprocess of forming an integrated circuit on a wafer (semiconductor substrate), and a post-process of completing, as a product, a chip of the integrated circuit formed on the wafer by the preprocess. The preprocess can include a step of exposing a wafer coated with a photosensitive agent using the above-mentioned exposure apparatus, and a step of developing the wafer. The post-process can include an assembly step (dicing and bonding) and packaging step (encapsulation). Also, a liquid crystal display device is manufactured by a step of forming a transparent electrode. The step of forming a transparent electrode can include a step of coating a glass substrate, on which a transparent conductive film is deposited, with a photosensitive agent, a step of exposing the glass substrate coated with the photosensitive agent using the above-mentioned exposure apparatus, and a step of developing the glass substrate.

The device manufacturing method according to this embodiment is more advantageous to at least one of the productivity and quality of devices than the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-052580, filed Mar. 3, 2008, which is hereby incorporated by reference herein in its entirety.

What is claimed is:

1. An exposure apparatus which exposes a substrate to pulsed light from a light source, the apparatus comprising:
   a plurality of optical units configured to form a path of the pulsed light, the plurality of optical units including an element configured to change sections, that the pulsed light enters, of the path; and
   a controller configured to specify a section, that the pulsed light enters, of the sections based on a state of the element, to obtain number of pulsed light that enter the specified section, and to cause a display to display information concerning maintenance of one of the plurality of optical units arranged in the specified section based on the obtained number.

2. An apparatus according to claim 1, wherein the controller is configured to cause the display to display at least one of the sections of which the number exceeds a threshold.

3. An apparatus according to claim 2, wherein the controller is configured to inhibit activation of the light source, so that the pulsed light does not enter one of the sections of which the number exceeds the threshold.

4. An apparatus according to claim 1, wherein the controller is configured to cause the display to display the information concerning maintenance based on a first threshold of the number for maintenance of one of the plurality of optical units, and a second threshold of the number for replacement of one of the plurality of optical units.

5. A method of manufacturing a device, the method comprising:
   exposing a substrate to light using an exposure apparatus defined in claim 1;
   developing the exposed substrate; and
   processing the developed substrate to manufacture the device.

* * * * *